United States Patent [19]

Chang et al.

[11] 3,929,527

[45] Dec. 30, 1975

[54] MOLECULAR BEAM EPITAXY OF ALTERNATING METAL-SEMICONDUCTOR FILMS

[75] Inventors: Leroy L. Chang, Lake Mohegan; Leo Esaki, Chappaqua; Rudolf Ludeke, Millwood, all of N.Y.

[73] Assignee: The United States of America as represented by the Secretary of the Army, Washington, D.C.

[22] Filed: June 11, 1974

[21] Appl. No.: 478,195

[52] U.S. Cl. .................... 148/175; 156/610; 357/4; 357/15; 357/16

[51] Int. Cl.$^2$ .................. H01L 21/203; H01L 21/84

[58] Field of Search ................ 148/175; 357/15, 16; 117/207, 217; 427/88, 90; 156/610

[56] References Cited

UNITED STATES PATENTS

| | | | |
|---|---|---|---|
| 3,309,553 | 3/1967 | Kroemer | 148/175 UX |
| 3,322,581 | 5/1967 | Hendrickson et al. | 148/175 |
| 3,337,375 | 8/1967 | Casey et al. | 357/15 X |
| 3,372,069 | 3/1968 | Bailey et al. | 148/175 |
| 3,375,418 | 3/1968 | Garnache et al. | 357/15 |
| 3,394,289 | 7/1968 | Lindmayer | 357/15 |
| 3,424,627 | 1/1969 | Michel et al. | 148/175 X |
| 3,466,510 | 9/1969 | Maute | 357/15 X |
| 3,839,084 | 10/1974 | Cho et al. | 148/175 X |

OTHER PUBLICATIONS

Chang et al., "Fabrication of Multilayer Devices," I.B.M. Tech. Discl. Bull., Vol. 15, No. 2, July 1972, pp. 365–366.

Hashimoto et al., "The Si–$WSi_2$–Si Epitaxial Structure," J. Electrochemical Soc., Vol. 114, No. 11, Nov. 1967, pp. 1189–1191.

Blum et al., "Vapor Growth of Gap onto Si Substrates," IBM Tech. Discl. Bull., Vol. 13, No. 5, Oct. 1970, p. 1245.

Esaki et al., "Novel Epitaxy," IBID., Vol. 16, No. 4, Sept. 1973, p. 1231.

*Primary Examiner*—L. Dewayne Rutledge
*Assistant Examiner*—W. G. Saba
*Attorney, Agent, or Firm*—Nathan Edelberg; Robert P. Gibson; Roy E. Gordon

[57] ABSTRACT

Alternately repeated layers of metal epitaxy on semiconductor substrates and semiconductor epitaxy on metal substrates are grown in an ultra-high vacuum evaporation system by first depositing the metal film on the clean surface of the semiconductor substrate over the temperature range between room temperature and 400°C; and then depositing the semiconductor film on the clean surface of the metal over the temperature range between 500°C and 600°C.

4 Claims, No Drawings

MOLECULAR BEAM EPITAXY OF ALTERNATING METAL-SEMICONDUCTOR FILMS

BACKGROUND OF THE INVENTION

This invention relates in general to an epitaxial growth method, and in particular, to the epitaxial growth of alternately repeated films of metals and semiconductors on metal or semiconductor substrates.

Since it is generally favorable to work with monocrystalline films in both material studies and device fabrications, there has been a growing effort to achieve epitaxy. In one instance, work has been reported for growing oriented semiconductor films on metal substrates by either vapor transport or electron-beam evaporation. In another instance, epitaxial metal films have been deposited onto semiconductor surfaces by conventional vacuum evaporation. However, in the known prior art, no work has been found in the growth of alternating epitaxial films of both metals and semiconductors.

SUMMARY OF THE INVENTION

The general object of the invention is to provide a novel epitaxial growth method. A further object is to provide such a method that will enable the fabrication of sophisticated structures, which have previously been technologically impossible.

The foregoing objectives have now been attained by providing a method of growing alternately repeated layers of metal epitaxy on semiconductor substrates and semiconductor epitaxy on metal substrates in an ultra-high vacuum system. This capability, together with the desirable features of high quality and extreme smoothness of the resulting films and of wide, achievable conductivity range of the semiconductors, is essential and required in most cases for the fabrication of a variety of sophisticated device structures.

DESCRIPTION OF THE PREFERRED EMBODIMENT

Using the technique of molecular beam evaporation (MBE) in ultrahigh vacuum, with multiple sources, monocrystalline aluminum films are deposited on the clean surface of GaAs or $Ga_{1-x}Al_xAs$ substrates over a temperature range between room temperature and 400°C. Subsequently, monocrystalline GaAs or $Ga_{1-x}Al_xAs$ films are grown on the clean aluminum surface over the temperature range between 500°and 600°C. The semiconductor and metal films are smooth and of high quality. The processes can be repetitively carried out with precise control of thickness in each layer as well as doping in semiconductor layers. The thickness of each layer of either the semiconductor or the metal films can be varied conveniently over a range from 10A to 5$\mu$. The present growth method is particularly advantageous in the thin or ultra-thin film region where the thickness control becomes critical and cannot be achieved by other methods.

When the (100) surface of the semiconductor is used for the deposition of aluminum, the growth of the metal film is observed to be the (110) orientation. When the semiconductor is redeposited on the aluminum metal, the (100) semiconductor surface is always restored. The epitaxial growth of aluminum can be partially attributed to the good lattice match with the semiconductor, and to the strong tendency of aluminum to be tetrahedrally bonded to the arsenic at the semiconductor-aluminum interface. The side length of the regular square on the (100) surface of GaAs or $Ga_{1-x}Al_xAs$, $5.65/\sqrt{2}$ A is approximately equal to the lattice constant of the face-centered cubic structure of aluminum, 4.0496 A.

The specific combination of GaAs or (GaAlAs, AlAs) and Al is employed here, both being technologically important and widely used materials. Al can be used with a great many other semiconductors: such as ZnSe, a II-VI compound semiconductor whose lattice matches that of Al; and GaPSb, an example of a III-V alloy semiconductor where the lattice constant can be varied by varying the alloy composition. Other metals that are potential candidates from the point of view of lattice matching include Ag and Au, both having the face-centered crystalline structure.

The applications of the present process open up new avenues of fabricating all-monocrystalline structures which have previously been technologically impossible. One example is to sandwich a metal between two semiconductors with two outside metal electrodes. The two outer metal-semiconductor combinations are used as emitter and collector, respectively, while the middle metal is the base. This is known as a metal-base transistor, that can be used for power amplification, and as detector and possibly oscillator at infrared and optical frequencies. Another example is to use the combination of semiconductor-metal-semiconductor-metal as the gate in an MOS transistor by making the semiconductor insulating. The outside, top metal is the usual gate electrode. The buried metal can be used either as a subsidiary gate electrode or as a sheet to accumulate electronic charge to achieve memory effect as in an MNOS structure.

While there has been described what is at present considered to be the preferred embodiment of this invention, it will be obvious to those skilled in the art that various changes and modifications may be made therein without departing from the invention.

What is claimed is:

1. Method of growing alternately repeated layers of aluminum epitaxy on semiconductor substrates selected from the group consisting of GaAs, AlAs and pseudobinary alloys of GaAs and AlAs of the formula $Ga_{1-x}Al_xAs$ and semiconductor epitaxy selected from the group consisting of GaAs, AlAs and pseudobinary alloys of GaAs and AlAs of the formula $Ga_{1-x}Al_xAs$ on said aluminum epitaxy layer in an ultra-high vacuum evaporation system including the steps of a. depositing the aluminum film on the clean surface of the semiconductor substrate over the temperature range between room temperature and 400°C; and b. depositing the semiconductor film on the clean surface of the aluminum over the temperature range between 500°C and 600°C.

2. Method according to claim 1 where the semiconductor is GaAs.

3. Method according to claim 1 where the semiconductor is AlAs.

4. Method according to claim 1 where the semiconductor is a pseudobinary alloy of the formula $Ga_{1-x}Al_xAs$.

* * * * *